US006400219B1

(12) United States Patent
Fayed

(10) Patent No.: US 6,400,219 B1
(45) Date of Patent: Jun. 4, 2002

(54) HIGH-SPEED OFFSET COMPARATOR

(75) Inventor: Ayman A. Fayed, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/640,115

(22) Filed: Aug. 16, 2000

(51) Int. Cl.$^7$ ............................................. H03F 1/02
(52) U.S. Cl. ...................... 330/9; 327/307; 330/253; 330/258
(58) Field of Search ........................... 330/9, 253, 258; 327/307

(56) References Cited

U.S. PATENT DOCUMENTS

| | | | | |
|---|---|---|---|---|
| 3,959,733 A | * | 5/1976 | Solomon et al. | 330/253 |
| 3,980,963 A | * | 9/1976 | Doi | 330/289 |
| 5,231,351 A | * | 7/1993 | Kordts et al. | 324/166 |
| 5,506,544 A | * | 4/1996 | Staudinger et al. | 330/289 |

OTHER PUBLICATIONS

Todd "FETs as voltage–variable resistors" Application Notes vol. 13 No. 19 pp 66–69 Sep. 13, 1965.*

Mel Bazes, "Two Novel Fully Complementary Self–Biased CMOS Differential Amplifiers," IEEE Journal of Solid–State Circuits, vol. 26, No. 2, pp. 165–168, Feb. 1991.

* cited by examiner

Primary Examiner—Michael B Shingleton
(74) Attorney, Agent, or Firm—J. Dennis Moore; W. James Brady, III; Frederick J. Telecky, Jr.

(57) ABSTRACT

A high-speed differential offset comparator circuit, providing a comparator function at a predetermined offset voltage. The differential offset comparator circuit includes a substantially zero offset comparator circuit having a first and a second differential input. The differential offset comparator circuit also includes a first pre-amplifier circuit and a second pre-amplifier circuit having an output coupled to the first and the second differential input, respectively, of the substantially zero offset comparator circuit. The pre-amplifier circuits are capable of providing a controllable offset to the differential offset comparator circuit. Each pre-amplifier circuit includes a first MOS transistor and a second MOS transistor connected in series to form a first composite transistor having an effective source, gate and drain. The first MOS transistor receives an input of the differential offset comparator circuit at a gate thereof. The second MOS transistor receives a control voltage corresponding to an offset control voltage at a gate thereof. The offset control voltage controls the value of the predetermined offset voltage.

4 Claims, 7 Drawing Sheets

HIGH-SPEED OFFSET COMPARATOR

BACKGROUND OF THE INVENTION

1. Field of the Invention

The present invention relates to integrated circuits and particularly to comparators used in high-speed applications.

2. Description of the Related Art

The function of a voltage comparator is to compare the instantaneous value of a signal voltage at one input to that of a voltage, often a reference voltage, at a second input and produce a voltage representing a digital value, i.e., a binary 1 or 0, at the output when one input is higher than the other. FIG. 1a shows the characteristics of a comparator 10 with inputs $V_{ip}$ and $V_{in}$ and output $V_o$, where all the signal levels are measured with reference to circuit ground. In this case, when the differential input voltage $V_{id}=V_{ip}-V_{in}$ exceeds 0 volts, the output switches from 0 volts, which is binary 0, to $V_{dd}$ volts, which is binary 1, as shown by the transfer curve.

Offset comparators have a certain built-in offset voltage $V_T$ associated with the differential input such that when the differential input signal exceeds this threshold, the output switches binary states. FIG. 1b shows a comparator 15 with a built-in threshold $V_T$. In this case, when the differential input voltage $V_{id}$ exceeds the offset threshold $V_T$, the output switches binary states. As illustrated in the accompanying transfer curve, the differential input voltage $V_{id}$ has to exceed the threshold voltage ($V_T$) before the output switches form 0 to $V_{dd}$.

Two conventional approaches for establishing this built-in offset voltage are discussed below. The first approach is illustrated in FIG. 2. FIG. 2 is a schematic diagram of an offset comparator that uses a common-mode tracking circuit to provide the threshold voltage $V_T$. The circuit is comprised of an operational amplifier made up of two differential n-channel input transistors 22–23, a tail current source 24, two p-channel load transistors 20–21, a differential offset circuit consisting of two additional differential n-channel input transistors 25–26, a second tail current source 27, and a common-mode tracking circuit 28. The differential input signals, $V_{ip}$ and $V_{in}$, are applied to both the operational amplifier's inputs at the gates of n-channel transistors 22–23 and to the differential inputs of the common-mode tracking circuit 28. The difference in the output signals from the common-mode tracking circuit 28, $V_{B1}$ and $V_{B2}$, represents the offset threshold voltage $V_T$. These $V_{B1}$ and $V_{B2}$ signals are inputs to the second differential pair consisting of n-channel transistors 25 and 26, respectively. Finally, the drains of transistors 25–26 are coupled to the drains of the operational amplifier differential pair transistors 22–23 to establish an offset.

Thus, in the first approach the desired offset voltage is accomplished by means of adding another differential pair 25–26, with its own separate tail current 27, in parallel to the input differential pair 22–23 of a 0-volt offset comparator. The added pair 25–26 should be identical to the input differential pair 22–23 of the 0-volt offset comparator, as should the tail currents 24, 27. A common-mode tracking circuit 28 is needed to supply the two bias voltages $V_{B1}$ and $V_{B2}$. This common-mode tracking circuit is called on to supply the $V_{B1}$ and $V_{B2}$ inputs such that $V_{B1}-V_{B2}$ is equal to the desired offset $V_T$, and at the same time such that $V_{B1}$ and $V_{B2}$ have the same common-mode level as the original inputs, $V_{ip}$ and $V_{in}$.

The second approach for establishing this built-in offset voltage is illustrated in FIG. 3. This approach uses two resistor networks 31–34 and 35–38 at the inputs of a operational amplifier 30. In this case, each resistor network, 31–34 and 35–38, is connected between the $V_{dd}$ voltage and circuit ground with voltage taps located between each resistor. In operation, the differential inputs $V_{ip}$ and $V_{in}$ are connected to taps on the respective resistor networks, while the + and − differential inputs to the operational amplifier 30 are taken off other resistor network taps to provide the desired offset for the comparator. This circuit has the characteristics of low input-impedance and high power dissipation.

The offset comparators discussed above either have a common-mode tracking circuit, or have low input impedance. The common-mode tracking circuit is very slow and not suitable if the differential input signal has a fast changing common-mode. On the other hand, the resistor network dissipates a great amount of power and gives a low input-impedance characteristic to the comparator. The above-described prior art circuits are also not directly compatible with many low-voltage digital applications and usually need another circuit to step down the output signal to the desired digital levels. Thus, they tend to be slow, dissipate too much power, and are not directly compatible with many low-voltage digital applications; one such example being the USB interface for computers.

What is needed is a high-speed comparator with a high input-impedance characteristic that can track high-speed differential signals with rapidly changing common-mode levels and provide a binary output signal that can directly interface with inputs of low-voltage applications. The invention disclosed herein addresses these needs and provides such a circuit.

SUMMARY OF THE INVENTION

In accordance with the present invention there is provided a high-speed differential offset comparator circuit, providing a comparator function at a predetermined offset voltage. The differential offset comparator circuit includes a substantially zero offset comparator circuit having a first and a second differential input. The differential offset comparator circuit also includes a first pre-amplifier circuit and a second pre-amplifier circuit having an output coupled to the first and the second differential input, respectively, of the substantially zero offset comparator circuit. The pre-amplifier circuits are capable of providing a controllable offset to the differential offset comparator circuit. Each pre-amplifier circuit includes a first MOS transistor and a second MOS transistor connected in series to form a first composite transistor having an effective source, gate and drain. The first MOS transistor receives an input of the differential offset comparator circuit at a gate thereof. The second MOS transistor receives a control voltage corresponding to an offset control voltage at a gate thereof. The offset control voltage controls the value of the predetermined offset voltage.

Circuits according to the present invention can track high-speed signals with rapidly changing common-mode levels without the need for a common-mode tracking circuit, while providing a high impedance input.

DETAILED DESCRIPTION OF THE PREFERRED EMBODIMENTS

The embodiments of the present invention disclosed herein provide a low-voltage, high-speed offset comparator that uses two pre-amplifiers at the differential inputs of an operational transconductance amplifier (OTA) to provide the necessary offset. These embodiments can track high-speed differential signals with rapidly changing common-mode levels without the use of a common-mode tracking circuit or resistor network. In addition, these embodiments include compensation against variations in the current due to variations in temperature and process, thus minimizing variations in power dissipation. These embodiments provide an offset to the comparator without lowering the high input-impedance characteristic of the zero offset comparator, and can internally convert the power level from 3.3 volts to 1.8 volts to provide a binary output signal level ready to interface with other low-voltage digital circuits without degrading the speed of the comparator circuit. They also consume low power.

The offset is accomplished advantageously in these embodiments within the pre-amplifier stage using two transistors as a composite transistor and another NMOS transistor. The composite transistor maintains the high input-impedance characteristics of the circuit. While not essential to implementations of the present invention, further circuitry may be employed in order to cancel the dependency of current through the composite transistor on process parameters and temperature variations, i.e., on $V_{T_{eq}}$. Advantageously, a second composite transistor and a bandgap generated current $I_b$ may be used for this purpose, although other circuitry may be used for this purpose, as well.

These embodiments can provide a binary output that is capable of interfacing directly with low voltage applications while still operating at high speeds, e.g., a test example ran at 800 MHz. The digital output signal can be made to switch between 0 and 1.8 volts, for example.

As mentioned above, these embodiments use input pre-amplifiers to provide the necessary offset threshold voltage. The pre-amplifiers use composite transistors in order to maintain high input-impedance nodes and to eliminate the need for a common-mode tracking circuit while maintaining high-speed operation. The circuits can operate from a 3.3V supply and internally convert the binary output to 1.8V.

Figure 1A:
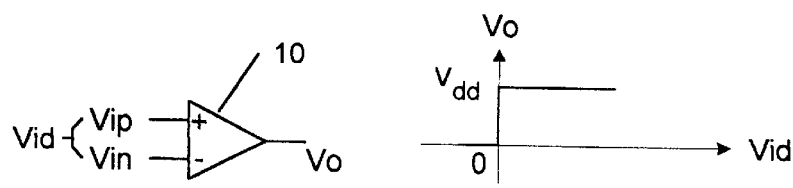
FIGS. 1a and 1b are transfer curves for prior art comparators with offset and without offset, respectively.
Figure 1B:
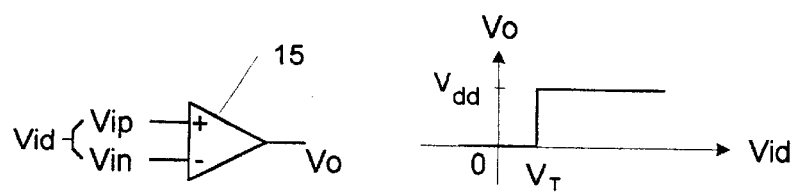
Figure 2:
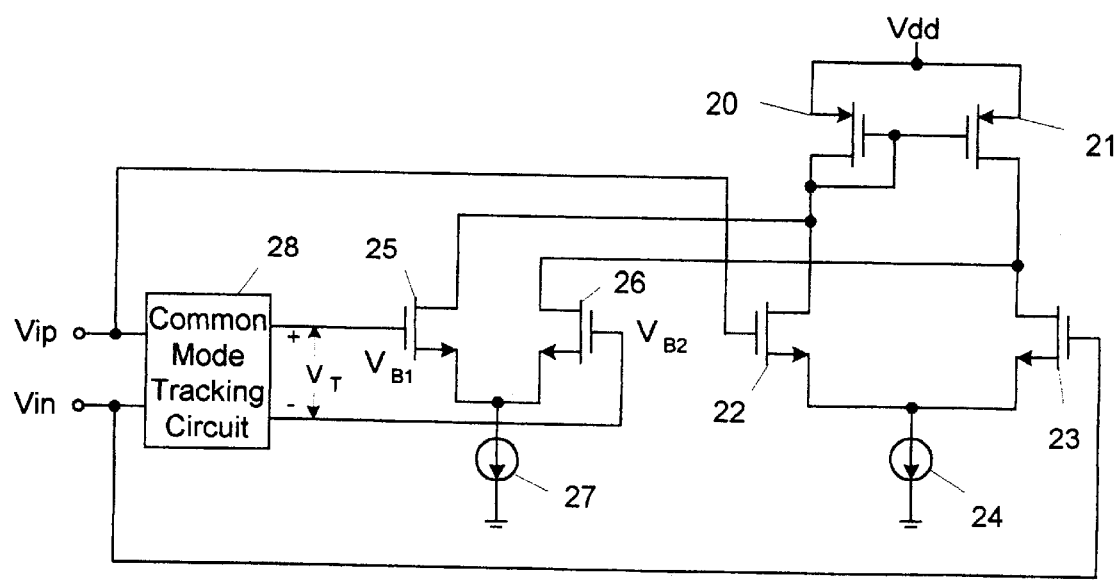
FIG. 2 is a schematic for a conventional, prior art offset comparator, which uses a common-mode tracking circuit to provide the necessary offset.
Figure 3:
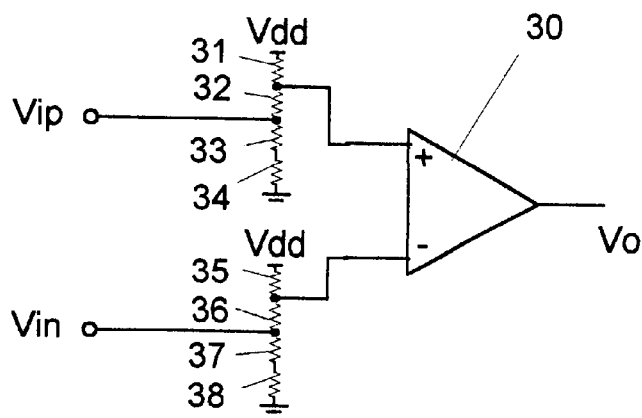
FIG. 3 is a schematic for a conventional, prior art offset comparator, which uses resistor divider network to provide the necessary offset.
Figure 4:
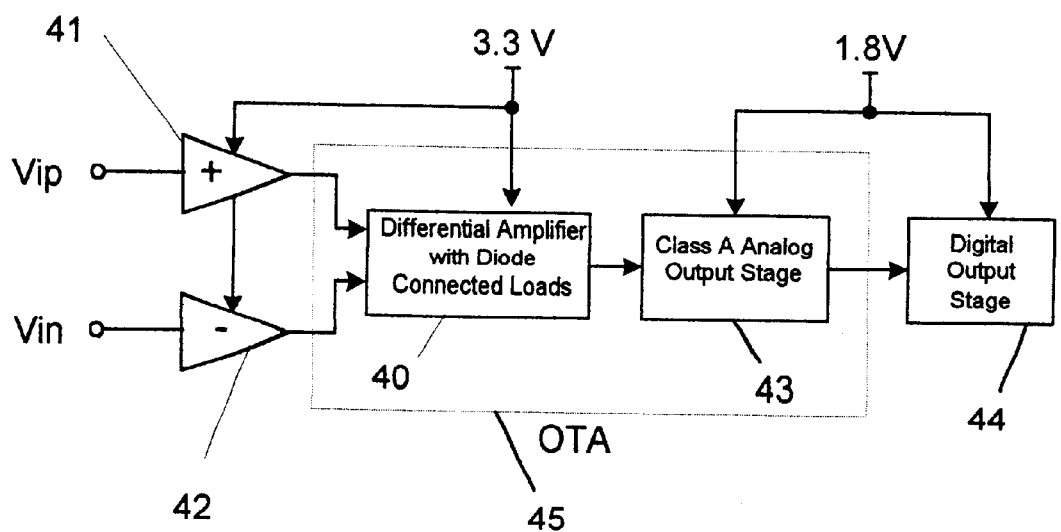
FIG. 4 is a block diagram for a preferred embodiment offset comparator in accordance with the present invention, which uses two pre-amplifiers to provide the necessary offset.

FIG. 4 is a block diagram of an offset comparator circuit comprising a preferred embodiment of the present invention. The circuit includes a pre-amplifier input stage made up of + and − input pre-amplifiers 41–42, a differential amplifier 40 with diode connected loads, a low-voltage class A analog output stage 43, and a low-voltage digital output stage 44. The differential amplifier 40 and the class A analog output stage 43 together form a current mirror operational transconductance amplifier (OTA) 45, which serves as the zero offset comparator. Any substantially zero offset comparator circuit may be used as the circuit following the pre-amplifier stage, but the OTA 45 disclosed herein is considered a preferred embodiment thereof, for the purpose of implementing the embodiments of the present invention disclosed herein. The input pre-amplifier stage provides three primary functions, as follows:

1) to add a predetermined offset threshold ($V_{TH}$) to the input differential signal, which effectively shifts the threshold voltage of the zero offset comparator from 0 to $V_{TH}$, 2) to introduce an initial amplification to the differential signal in order to enhance the resolution and speed of the circuit, and 3) to introduce buffering between the input data lines and the zero offset comparator to avoid any kickback in the circuit. Such kickback happens in circuits employing positive feedback.

The current mirror operational transconductance amplifier 45 can be a conventional circuit that provides high-speed and gain. The circuit shown in FIG. 4 uses differential amplifier 40 with two diode connected loads to mirror the currents to the class A output stage 43. The class A analog output stage 43 converts the signal level from 3.3 volts to 1.8 volts to provide interfacing compatibility with low voltage digital applications, and also provides high gain to the circuit. The circuit also uses active resistors (transistors with a long channel) that are smaller in physical size than passive resistor elements to enhance the speed of the current mirrors used to implement the OTA 45. Finally, a digital output stage 44 is provided, made of multiple inverters coupled in series. The digital output stage 44 is also not essential to implementations of the present invention, but advantageously provides more gain to the circuit, to provide a digital output, and to drive a capacitive load.

Figure 5:
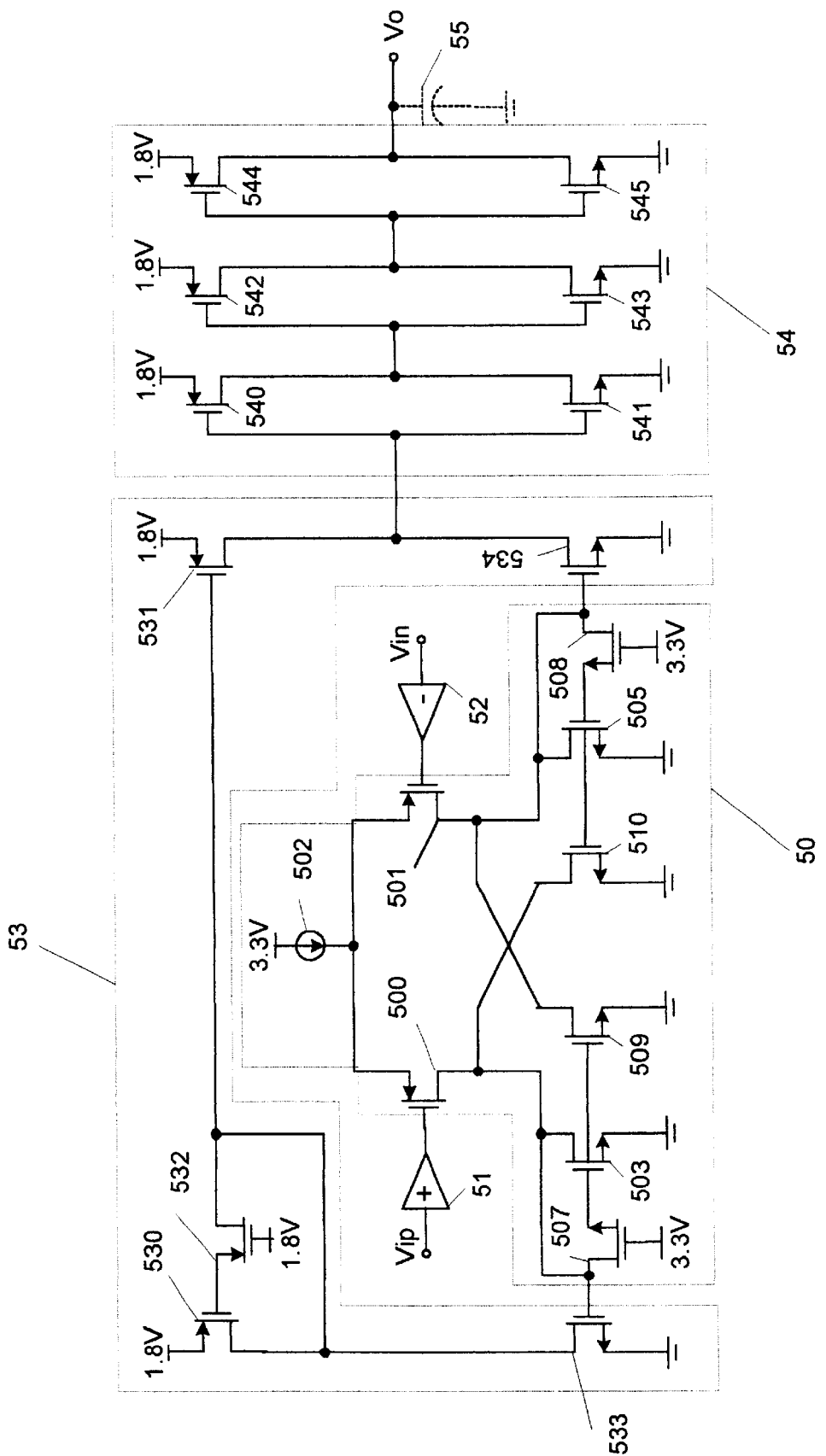
FIG. 5 is a schematic for a preferred embodiment offset comparator in accordance with the present invention, which shows the input pre-amplifiers and a low-voltage output stage.

FIG. 5 is a schematic diagram of the offset comparator shown in FIG. 4. The circuit is comprised of a differential amplifier with two diode connected loads 50, corresponding to block 40 of FIG. 4, differential input pre-amplifiers 51–52, corresponding to amplifiers 41, 42, of FIG. 4, a class A analog output stage 53, corresponding to block 43 of FIG. 4, and a low-voltage digital output stage 54, corresponding to block 44 of FIG. 4, that is capable of driving a capacitive load 55 at high speeds. The combination of the differential amplifier 50 and the class A analog output stage 53 make up an operational transconductance amplifier (OTA), which serves as the zero offset comparator. In operation, differential input signals $V_{ip}$ and $V_{in}$ are applied to the pre-amplifier inputs and a single-ended binary output signal is provided at the output. The OTA 45 is a standard circuit consisting of an input differential p-channel transistor pair 500–501, a current source 502, and simple current mirrors 503–533, 505–534 with high-speed compensation resistors. However, instead of using passive resistors, which requires large chip area, the resistor function is provide by means of active transistors 507–508 with a long channel. In this application it is possible to use transistors for this function since their linearity is not critical due to the large gain of the OTA. In addition, positive feedback is introduced into the circuit with n-channel transistors 509–510 to enhance both the speed and gain of the OTA 45.

While the OTA 45 operates from power supplies as low as 3.3 volts, n-channel/p-channel transistors 533/530 and 534/531 are part of a class A analog output stage 53 that operates from a 1.8 volt supply. This output stage 53 serves two primary purposes, that is, it provides high gain output by supplying a high impedance node, and in addition it converts the 3.3 volt differential signal supplied by the differential pair to a single-ended 1.8 volt binary signal $V_{o1}$. This is achieved by using a 1.8V supply to power the class A analog output stage 53 of the OTA 45, while using a 3.3V supply to power the input differential amplifier 50 of the OTA 45. Notice the novel arrangement in the circuit, where transistors 503, 509, 510, and 505 are supplied from 3.3 volts, while transistors 530, 533, 531, and 534 are supplied from 1.8 volts.

The digital output stage 54 is comprised of a series of inverters (three shown for optimal speed), consisting of p-channel/n-channel transistor pairs 540/541, 542/543, 544/545, respectively. This stage helps drive capacitive loads with optimum speed.

Figure 6:
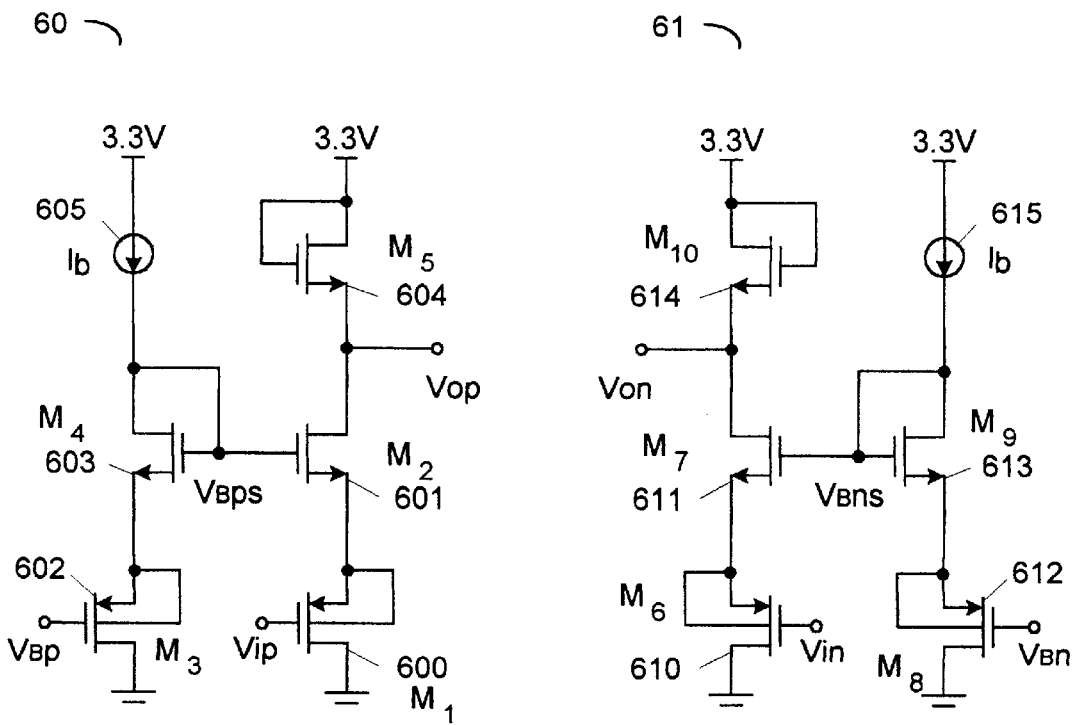
FIG. 6 includes detailed schematics for the two pre-amplifiers of the preferred embodiments of the present invention, which use composite transistors to provide a high impedance input while operating at high speed.

FIG. 6 is a schematic for the $V_{ip}$ pre-amplifier 60 and the $V_{in}$ pre-amplifier 61. These circuits are substantially the same, and each uses advantageously two composite transistors, as described below in connection with FIG. 7, where two transistors are used and are equivalent to a single n-channel transistor with both gate and source having substantially infinite, i.e., extremely high, input impedance.

Figure 7:
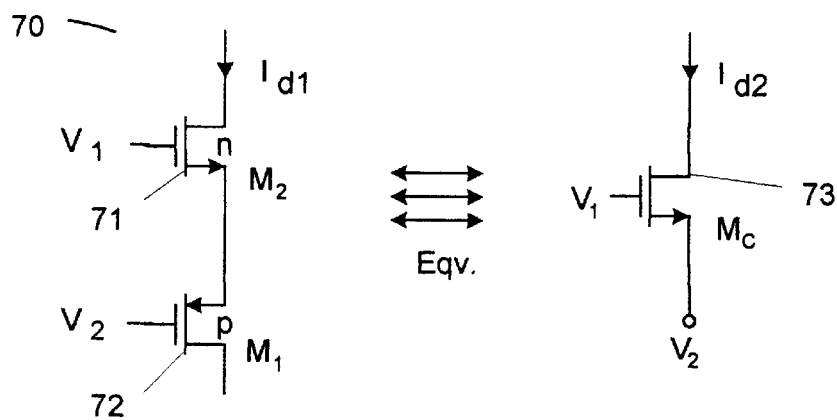
FIG. 7 is a schematic illustrating the composite transistor effect.

The schematic of FIG. 7 shows two transistors 70, a p-channel transistor ($M_1$) 72 and a n-channel transistor ($M_2$) 71, which together are called a composite transistor. This composite transistor is equivalent to a single n-channel transistor ($M_c$) 73 having, as a practical matter, infinite input impedance at both the gate $V_1$ and source $V_2$. Although these two circuits are equivalent, in the two transistor configuration 70, V1 and V2 are applied to the gates of the n-channel transistor 71 and the p-channel transistor 72, respectively, rather than to the gate and source as shown in the equivalent transistor 73. As a result, since these are MOS transistors, this provides a high input impedance at both nodes.

The equivalence of these two circuits can be shown by the equations for the currents ($I_d$) flowing in them, as follows:

For the two transistor high-impedance configuration 70, (1)

$$I_{d1} = \frac{K_{eq}}{2}((V_1 - V_2) - V_{Teq})^2,$$

and for a simple n-channel transistor 73, $$I_{d2} = \frac{K}{2}(V_{gs} - V_{Tn})^2 = \frac{K}{2}((V_1 - V_2) - V_{Tn})^2;$$

where

K represents the aspect ratio of the transistor times $\mu$ times $C_{oxide}$ of a transistor, where mu is the current carriers in the transistor, and Coxide is the gate capacitance of the transistor per unit area.

$$\frac{1}{\sqrt{K_{eq}}} = \frac{1}{\sqrt{K_n}} + \frac{1}{\sqrt{K_p}},$$

and $V_{Teq} = V_{Tn+|VTp|} =$ threshold voltage of composite transistor, which is dependent on temperature and process variations. From equations (1) and (2) it is seen that the currents $I_{d1}$ and $I_{d2}$ have the same form and are equivalent; i.e., the equations are the same, only the parameters are different. In an application, the signal is applied to the substantially infinite impedance at the gate of p-channel transistor 72 rather than the lower impedance source of the simple n-channel transistor 73. In the comparator circuit of this invention, two of these n-channel/p-channel transistor 71, 72 configurations are used in each of the two pre-amplifiers 60, 61 at the comparators input, to provide a high input-impedance, and without limiting the speed through eliminating the need for a common-mode tracking circuit.

Referring back to the two identical pre-amplifier circuits 60, 61 of FIG. 6 for the $V_{ip}/V_{in}$ input signals, two composite transistors are used in each pre-amplifier; i.e., a first n-channel transistor/p-channel transistor pair 601, 600 and a second n-channel transistor/p-channel transistor pair 603, 602 in circuit 60, and a first n-channel transistor/p-channel transistor pair 611, 610 and a second n-channel transistor/ p-channel transistor pair 613/, 612 in circuit 61. The circuits also include n-channel load transistors 604, 614 and current sources 605, 615, respectively. However, the two composite transistors in each circuit are slightly different with transistors 603 and 613 each being wired like a diode where their gate and drain are tied together. The two pre-amplifier circuits 60, 61 are, as mentioned above, substantially the same, with one circuit 60 used for the $V_{ip}/V_{op}$ signal and the other circuit 61 used for the $V_{in}/V_{on}$ signal. In operation, the offset voltages $V_{Bp}/V_{Bn}$ are applied at the gates of n-channel transistors 602, 612, respectively, while the differential input signals $V_{ip}/V_{in}$ are applied at the high input impedance gates of p-channel transistors 600, 610, respectively.

By replacing transistors $M_1$ 600 and $M_2$ 601 in the $M_1$ 600, $M_2$ 601, $M_5$ 604 leg of the pre-amplifier circuit 60 with its equivalent simple n-channel transistor $M_c$, this equivalent circuit can be used to show mathematically that this preamplifier circuit adds an offset voltage to the comparator and maintains a high input-impedance without the need for a common-mode tracking circuit. Also, the offset voltage of the output of the preamplifier circuits can be accurately controlled simply by controlling the voltages $V_{Bp}$ and $V_{Bn}$, since the output offset is a function of ($V_{Bp}-V_{Bn}$). In addition, gain can be produced through this circuit at the input to the OTA to further enhance the speed.

Figure 8:
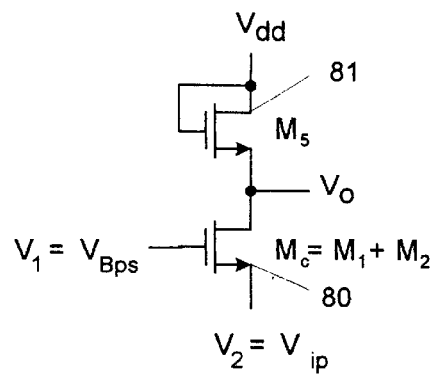
FIG. 8 is a schematic of the composite transistor used in the calculations of the application to verify that the current consumption of the circuit depends only on transistor layout size.

FIG. 8 shows the equivalent for $M_1$, $M_2$, $M_5$ leg of the circuit for use in these calculations. The current flowing in n-channel transistor $M_c$ 80 is given as (3)
$$I_{M1,2} = \frac{K_{eq}}{2}((V_{Bps} - V_{ip}) - V_{Teq})^2,$$

where $V_{BPs}$ is the gate input to the n-channel transistor $M_c$ 80. Also, (4)
$$I_{M5} = \frac{K_{M5}}{2}(V_{dd} - V_{op} - V_{Tn})^2.$$

Since the same current is flowing in both $M_5$ and $M_c$ transistors, then (5) $I_{M1,2}=I_{M5}$ and the right side of these two equations can be set equal to each other to give, (6)
$$\frac{K_{M5}}{2}(V_{dd} - V_{op} - V_{Tn})^2 = \frac{K_{eq}}{2}((V_{Bps} - V_{ip}) - V_{Teq})^2,$$

and
(7)
$$V_{dd} - V_{op} - V_{Tn} = \sqrt{\frac{K_{eq}}{K_{M5}}}(V_{Bps} - V_{ip} - V_{Teq}).$$

Solving for $V_{op}$ gives
(8)
$$V_{op} = V_{dd} - V_{Tn} - \sqrt{\frac{K_{eq}}{K_{M5}}}(V_{Bps} - V_{ip} - V_{Teq}).$$

And since the same equations apply for the identical $V_{in}$ pre-amplifier, the $V_{on}$ voltage output can be written as
(9)
$$V_{on} = V_{dd} - V_{Tn} - \sqrt{\frac{K_{eq}}{K_{M5}}}(V_{Bns} - V_{in} - V_{Teq}).$$

The differential output is then determined as
(10)
$$V_{op} - V_{on} = \sqrt{\frac{K_{eq}}{K_{M5}}}(V_{Bns} - V_{in} - V_{Teq} - V_{Bps} + V_{ip} + V_{Teq})$$

(11)
$$= \sqrt{\frac{K_{eq}}{K_{M5}}}((V_{ip} - V_{in}) - (V_{Bps} - V_{Bns})).$$

Equation (11) clearly shows
1) the differential input $V_{ip}-V_{in}$ which has a high input impedance due to the MOS gates of the composite transistors used to represent this input,
2) the offset voltage $V_{Bps-VBns}$ and 3) a gain function $$\sqrt{\frac{K_{eq}}{K_{M5}}}$$

that can be used to further improve the circuit's speed, which depends only on the physical size ($K_{eq}$, $K_{M5}$) of the transistors. This gain can be controlled by making the size of transistor $M_5$ 604 smaller than that of transistors $M_1$ 600 and $M_2$ 601.

This approach meets the desired goals for the high-speed offset comparator with the exception of one additional problem; i.e., the current $I_{M1,2}$ in equation (3) still includes $V_{Teq}$, which is process parameter and temperature dependent. This issue is addressed by the other leg of the pre-amplifier circuits, made up of $I_b$ current source 605, 615, n-channel transistors $M_4$ 603, $M_9$ 613, and p-channel transistors $M_3$ 602, $M_8$ 612. The input to transistors M3 602 and $M_8$ 612 represents the differential offset voltage. Currents $I_b$ from current sources 605 and 615 may both be generated from the same conventional band-gap circuit (not shown), which is known to provide a stable current.

The following equations illustrate that the current $I_{M1,2}$ is independent of $V_{Teq}$ factors.
(12)
$$I_b = \frac{K_{eq'}}{2}(V_{Bps} - V_{Bp} - V_{Teq})^2,$$

where the $K_{eq'}$ in this circuit leg is different from that of the circuit's output leg. Rearranging this equation to give $V_{Bps}$ yields

(13)
$$V_{Bps} = V_{Bp} + V_{Teq} + \sqrt{\frac{2I_b}{K_{eq'}}}$$

and again since the two pre-amplifiers are identical
(14)
$$V_{Bns} = V_{Bn} + V_{Teq} + \sqrt{\frac{2I_b}{K_{eq'}}}.$$

The difference between $V_{Bps}$ and $V_{Bns}$ gives
(15) $V_{Bps}-V_{Bns}=V_{Bp}-V_{Bn}$, which is completely controlled and free from $V_{Teq}$ process parameter and temperature effects.

Now by replacing $V_{Bps}$ in equation (3) with the value derived in equation (13) gives
(16)
$$I_{M1,2} = \frac{K_{eq}}{2}\left(V_{Bp} + V_{Teq} + \sqrt{\frac{2I_b}{K_{eq'}}} - V_{ip} - V_{Teq}\right)^2$$

(17)
$$= \frac{K_{eq}}{2}\left(V_{Bp} + \sqrt{\frac{2I_b}{K_{eq'}}} - V_{ip}\right)^2,$$

and equation (11) becomes (18)

$$V_{op} - V_{on} = \sqrt{\frac{K_{eq}}{K_{M5}}} \left( (V_{ip} - V_{in}) - \left( V_{Bp} + V_{Teq} + \sqrt{\frac{2I_b}{K_{eq'}}} - V_{Bn} - V_{Teq} - \sqrt{\frac{2I_b}{K_{eq'}}} \right) \right).$$

(19)

$$= \sqrt{\frac{K_{eq}}{K_{M5}}} ((V_{ip} - V_{in}) - (V_{Bp} - V_{Bn})).$$

As shown in equation (19), the differential output of the pre-amplifier stage is a shifted version of the original differential input signal with a gain factor $$\sqrt{\frac{K_{eq}}{K_{M5}}}.$$

Also, equation (17) shows that the current $I_{M1,2}$ is no longer dependent on $V_{Teq}$, which significantly helps in minimizing variations in the power dissipation and the current flowing in the circuit due to variations in process and temperature.

Figure 9:
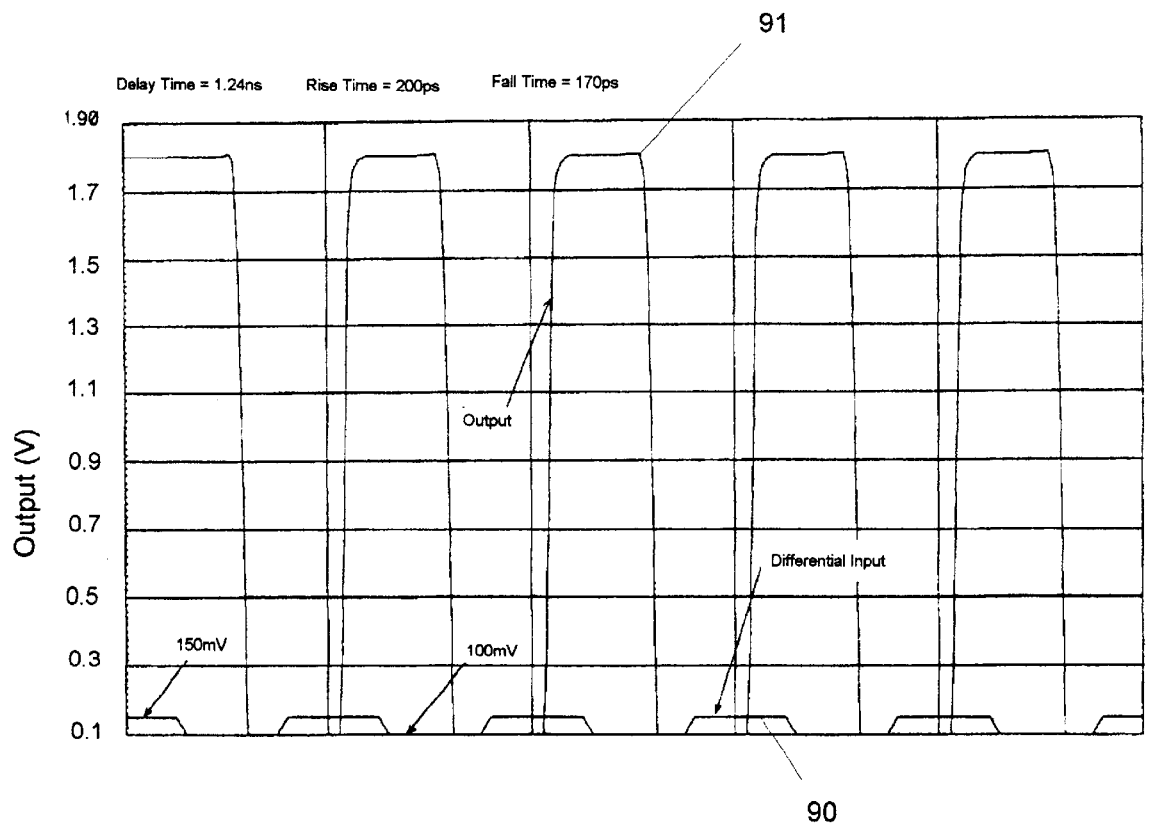
FIG. 9 is a plot showing the transient response time for a test circuit using the techniques of this invention.

FIG. 9 is a plot from a test circuit showing the transient response time for an embodiment of high-speed offset comparator utilizing the principles of the present invention. In this example, the circuit has a differential input 90 oscillating between 100 mV and 150 mV and a binary output 91 that switches between 0 and +1.8 V. This particular circuit was designed to have a 125 mV offset. The output has rise and fall times of 200 psec and 170 psec, respectively, and the input frequency is 500 MHz for this particular circuit.

Figure 10:
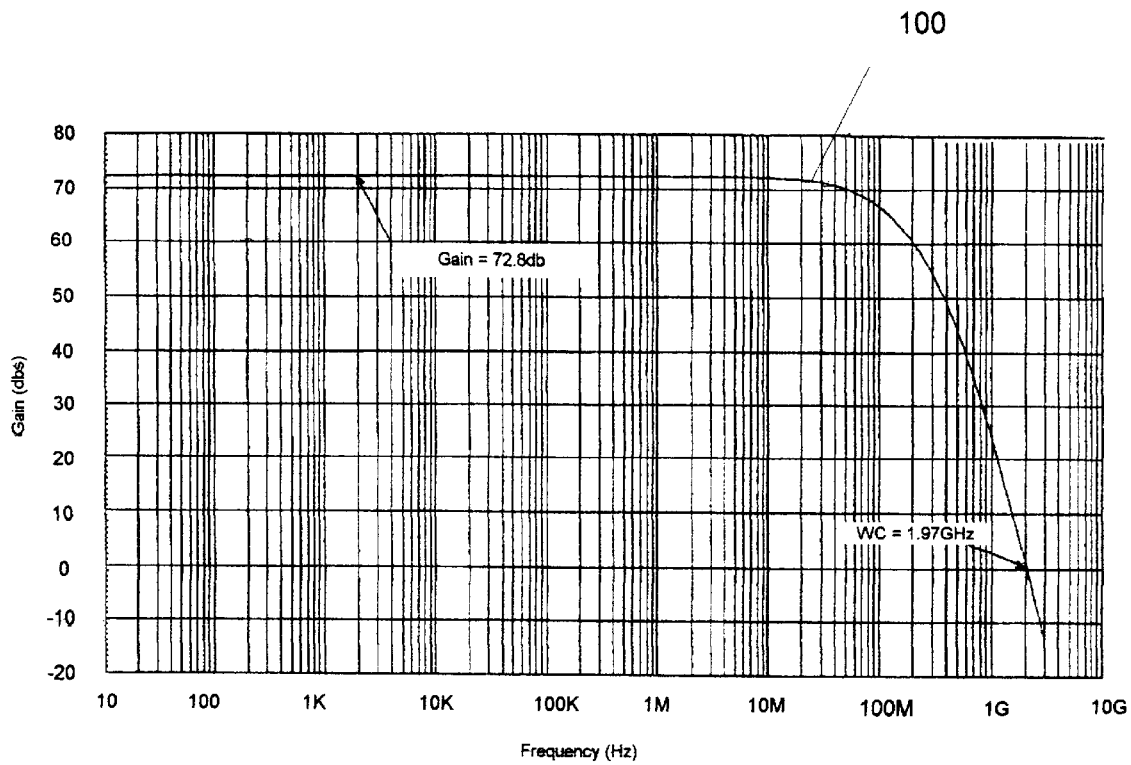
FIG. 10 is a plot showing the frequency response in a test circuit using the techniques of this invention.

FIG. 10 shows the frequency response curve 100 for the same test circuit. The circuit has a gain of >72 db to the roll-off, which starts beyond 10 MHz, and has a unity gain frequency of approximately 2 GHz.

Figure 11:
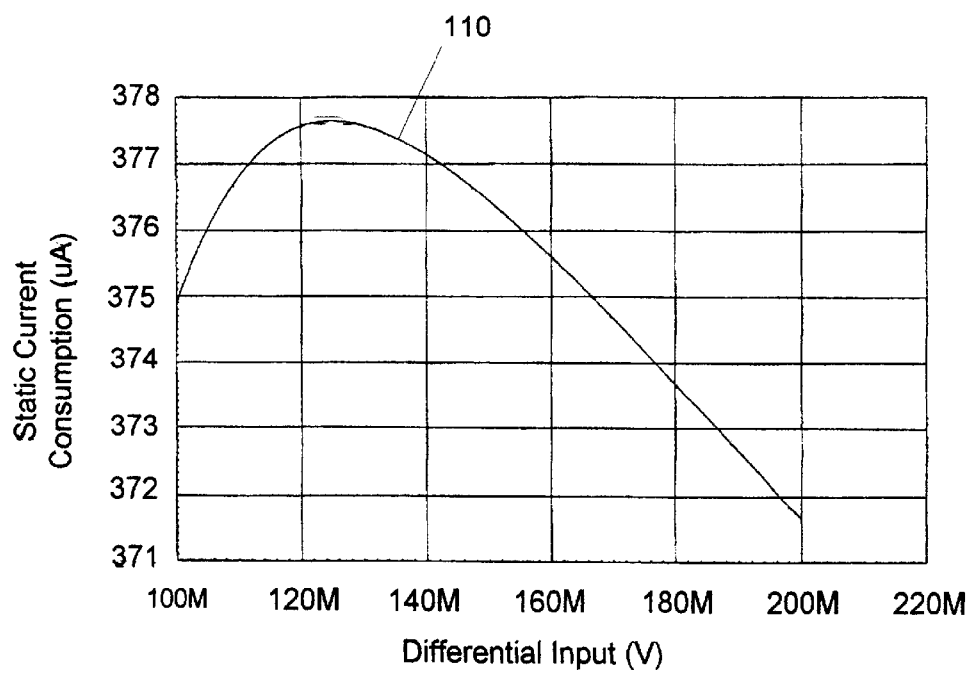
FIG. 11 is a plot illustrating the power consumption for a circuit constructed in accordance with the principles of the present invention.

FIG. 11 shows the static current in the same test circuit. The current 110 peaks at <378 μA for a differential input of approximately 125 mV.

Figure 12:
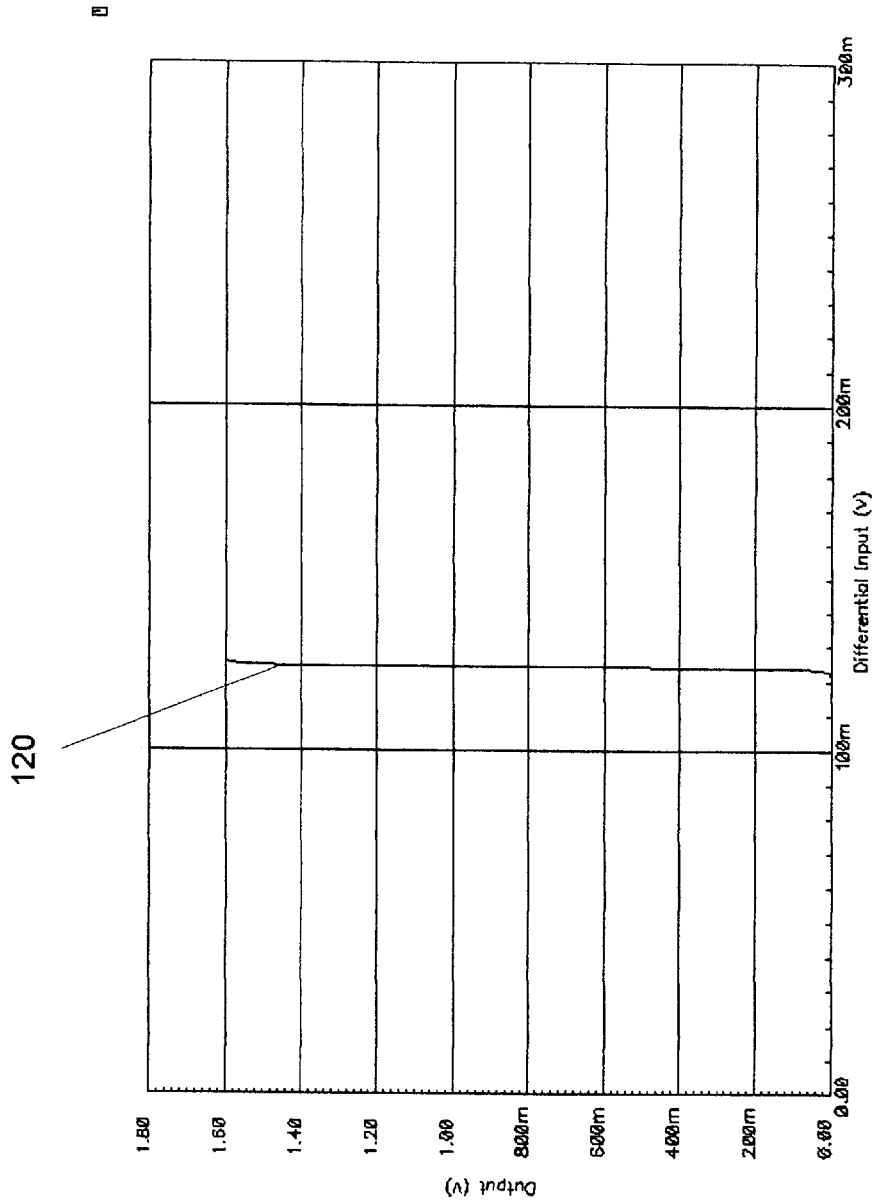
FIG. 12 is a plot showing the DC response for a high-speed offset comparator constructed in accordance with the principles of the present invention.

FIG. 12 is a plot from the same test circuit showing the DC response (output 120 vs. input) of the high-speed offset comparator. This circuit exhibited an offset of 125 mV.

The above description has demonstrated that the preferred embodiments of the present invention described herein have numerous advantages. These advantages include the adding of offset voltage without the need for a common-mode tracking circuit and thus without affecting the circuit speed. In addition, these embodiments preserve the high input-impedance characteristics of the circuit. A gain factor is added that further enhances the speed of the circuit. In addition, these embodiments provide stable operation that depends only on transistor layout size; i.e., $$\sqrt{\frac{2I_b}{K_{eq'}}}$$

factors, and eliminates any power consumption dependency on process parameters and temperature variations.

Although the present invention and its advantages have been described in detail, it should be understood that various changes, substitutions and alterations can be made herein without departing from the spirit and scope of the invention as defined by the appended claims. For example, as mentioned above, any zero offset comparator can be used as the stage following the pre-amplifiers. Essentially, the inventive concept presented herein is the use of composite transistors as a pre-amplifier stage to a zero offset comparator, to add the desire offset, with the advantages describe in detail above.

What is claimed is:

1. A high-speed differential offset comparator circuit, providing a comparator function at a predetermined offset voltage, comprising:

a substantially zero offset comparator circuit having a first and a second differential input; and a first pre-amplifier circuit and a second pre-amplifier circuit having an output coupled to said first and said second differential input, respectively, of said substantially zero offset comparator circuit, capable of providing a controllable offset to said circuit, wherein said first and second pre-amplifier circuits each comprise a first MOS transistor and a second MOS transistor connected in series to form a first composite transistor having an effective source, gate and drain, said first MOS transistor receiving an input of said differential offset comparator circuit at a gate thereof and said second MOS transistor receiving a control voltage corresponding to an offset control voltage at a gate thereof, said offset control voltage controlling the value of said predetermined offset voltage, wherein said first and second pre-amplifier circuits each further comprise a diode connected MOS transistor connected to the effective drain of said first composite transistor and in series therewith between the terminals of a voltage source, wherein the output of said pre-amplifier circuit comprises the common connection node of said diode connected MOS transistor and said first composite transistor, wherein said first and second pre-amplifier circuits each further comprise compensation circuitry functioning to cancel dependency of current through said first composite transistor on temperature and process variations, and wherein said compensation circuitry comprises a third MOS transistor and a fourth MOS transistor connected in series to form a second composite transistor, said third MOS transistor receiving said offset control voltage at a gate thereof and said fourth MOS transistor providing at a gate thereof said control voltage to said gate of said second MOS transistor.

2. A high-speed differential offset comparator circuit, providing a comparator function at a predetermined offset voltage, comprising:

a substantially zero offset comparator circuit having a first and a second differential input; and a first pre-amplifier circuit and a second pre-amplifier circuit having an output coupled to said first and said second differential input, respectively, of said substantially zero offset comparator circuit, capable of providing a controllable offset to said circuit, wherein said first and second pre-amplifier circuits each comprise a first MOS transistor and a second MOS transistor connected in series to form a first composite transistor having an effective source, gate and drain, said first MOS transistor receiving an input of said differential offset comparator circuit at a gate thereof and said second MOS transistor receiving a control voltage corresponding to an offset control voltage at a gate thereof, said offset control voltage controlling the value of said predetermined offset voltage, wherein said pre-amplifier further comprises:
- a first n-channel transistor having a gate and a drain thereof tied together and to a supply voltage, and having a source;
- a second n-channel transistor having a drain thereof coupled to the source of said first n-channel transistor and to said pre-amplifier output node, and having a source and a gate;
- a first p-channel transistor having a source and back-gate thereof coupled to the source of said second n-channel transistor, having a drain thereof tied to circuit ground, and having a gate thereof tied to one side of the differential input voltage;
- a band-gap generated current source having a first terminal and a second terminal;
- a third n-channel transistor having a gate and drain thereof coupled to the gate of said second n-channel transistor and to the first terminal of a band-gap generated current source;
- the gate of said third n-channel transistor being coupled to the source and back-gate of said second p-channel transistor;
- the drain of said second p-channel transistor tied to circuit ground;
- the gate of said second p-channel transistor tied to one side of a threshold voltage; and
- the second terminal of said current source being tide to said supply voltage.

3. The apparatus of claim 1, wherein said first and second pre-amplifier circuits each further comprise a current source connected to the effective drain of said second composite transistor and in series therewith between the terminals of said voltage source.

4. The apparatus of claim 3, wherein the gate of said fourth transistor is connected to the drain of said fourth transistor.

* * * * *